(12) United States Patent
Kawashima et al.

(10) Patent No.: US 8,921,200 B2
(45) Date of Patent: Dec. 30, 2014

(54) NONVOLATILE STORAGE ELEMENT AND METHOD OF MANUFACTURING THEREOF

(75) Inventors: Yoshio Kawashima, Osaka (JP); Takumi Mikawa, Shiga (JP); Shinichi Imai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/110,163

(22) PCT Filed: Apr. 11, 2012

(86) PCT No.: PCT/JP2012/002521
§ 371 (c)(1),
(2), (4) Date: Oct. 7, 2013

(87) PCT Pub. No.: WO2012/140887
PCT Pub. Date: Oct. 18, 2012

(65) Prior Publication Data
US 2014/0024197 A1    Jan. 23, 2014

(30) Foreign Application Priority Data
Apr. 14, 2011    (JP) .................................. 2011-090058

(51) Int. Cl.
*H01L 21/20*    (2006.01)
*H01L 45/00*    (2006.01)
*H01L 27/24*    (2006.01)

(52) U.S. Cl.
CPC ........ *H01L 45/1675* (2013.01); *H01L 27/2436* (2013.01); *H01L 45/04* (2013.01); *H01L 45/08* (2013.01); *H01L 45/1233* (2013.01); *H01L 45/146* (2013.01)
USPC .......................................... 438/382; 438/381

(58) Field of Classification Search
USPC .................................................. 438/381, 382
See application file for complete search history.

(56) References Cited

U.S. PATENT DOCUMENTS

| | | | |
|---|---|---|---|
| 6,303,486 | B1 | 10/2001 | Park |
| 6,794,279 | B1 | 9/2004 | Stephen et al. |
| 7,417,271 | B2 | 8/2008 | Genrikh et al. |
| 7,935,977 | B2 | 5/2011 | Lee et al. |
| 7,981,760 | B2 | 7/2011 | Kawashima et al. |

(Continued)

FOREIGN PATENT DOCUMENTS

| | | |
|---|---|---|
| JP | 06-151383 | 5/1994 |
| JP | 10-340893 | 12/1998 |

(Continued)

OTHER PUBLICATIONS

English translation of JP 10340893.*

(Continued)

*Primary Examiner* — Bradley K Smith
(74) *Attorney, Agent, or Firm* — Wenderoth, Lind & Ponack L.L.P.

(57) ABSTRACT

A method of manufacturing a variable resistance nonvolatile memory element includes: forming a lower electrode layer above a substrate; forming, on the lower electrode layer, a variable resistance layer including an oxygen-deficient transition metal oxide; forming an upper electrode layer on the variable resistance layer; and forming a patterned mask on the upper electrode layer and etching the upper electrode layer, the variable resistance layer, and the lower electrode layer using the patterned mask. In the etching, at least the variable resistance layer is etched using an etching gas containing bromine.

10 Claims, 11 Drawing Sheets

(56) References Cited

U.S. PATENT DOCUMENTS

| | | |
|---|---|---|
| 8,295,077 B2 | 10/2012 | Murooka |
| 8,389,972 B2 | 3/2013 | Mikawa et al. |
| 2007/0200158 A1 | 8/2007 | Genrikh et al. |
| 2008/0199975 A1 | 8/2008 | Park et al. |
| 2009/0321764 A1 | 12/2009 | Lee et al. |
| 2010/0190313 A1 | 7/2010 | Kawashima et al. |
| 2011/0074539 A1* | 3/2011 | Tsuji ............................ 338/20 |
| 2011/0205783 A1 | 8/2011 | Murooka |
| 2011/0220863 A1* | 9/2011 | Mikawa et al. .................... 257/4 |
| 2013/0092893 A1 | 4/2013 | Kawashima et al. |
| 2013/0140514 A1 | 6/2013 | Mikawa et al. |

FOREIGN PATENT DOCUMENTS

| | | |
|---|---|---|
| JP | 10340893 A * | 12/1998 |
| JP | 2003-521123 | 7/2003 |
| JP | 2003-534658 | 11/2003 |
| JP | 2004-296477 | 10/2004 |
| JP | 2004-356575 | 12/2004 |
| JP | 2005-203612 | 7/2005 |
| JP | 2007-235139 | 9/2007 |
| JP | 2008-199030 | 8/2008 |
| JP | 2009-004725 | 1/2009 |
| JP | 2009-226660 | 10/2009 |
| JP | 2009-302334 | 12/2009 |
| JP | 2009-545117 | 12/2009 |
| JP | 2010-009669 | 1/2010 |
| WO | 01/56077 | 8/2001 |
| WO | 01/91168 | 11/2001 |
| WO | 2008/002760 | 1/2008 |
| WO | 2008/013402 | 1/2008 |
| WO | 2008/058264 | 5/2008 |
| WO | 2009/136493 | 11/2009 |
| WO | 2011/030559 | 3/2011 |
| WO | 2012/001978 | 1/2012 |

OTHER PUBLICATIONS

International Search Report issued May 29, 2012 in International (PCT) Application No. PCT/JP2012/002521.

* cited by examiner

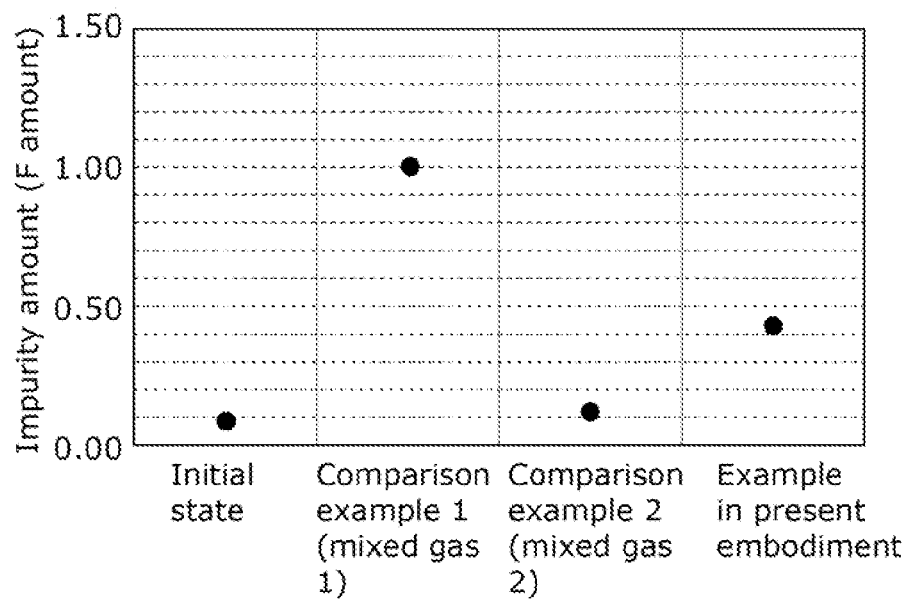
FIG. 3B
FIG. 4
| Beam diameter | 100 μm | X-ray irradiation | Spot |
| --- | --- | --- | --- |
| Electron analyzer angle | 45 degrees* | Step size | 0.100 |
| Pass Energy | 23.5 V | Irradiation energy | HP mode |
| Reference element | C1s | Vacuum | 3.4E-9 torr |
| X-ray source | AlKα | Neutralization gun | Not included |
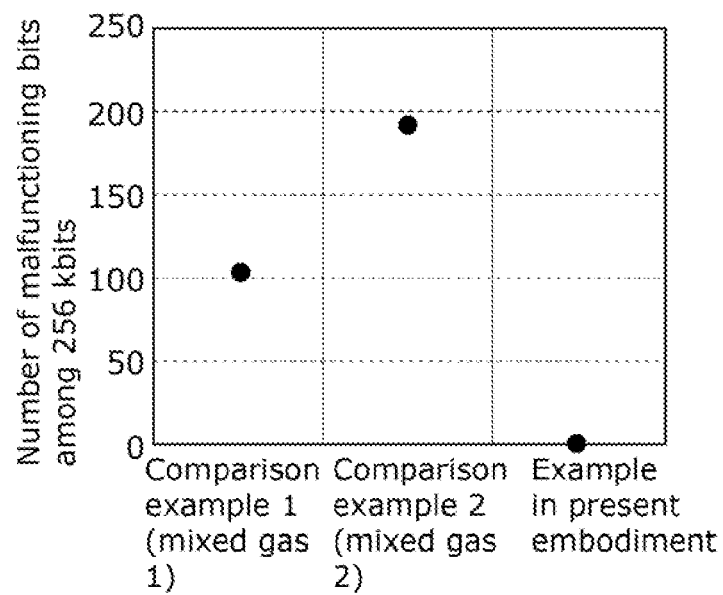
FIG. 5A

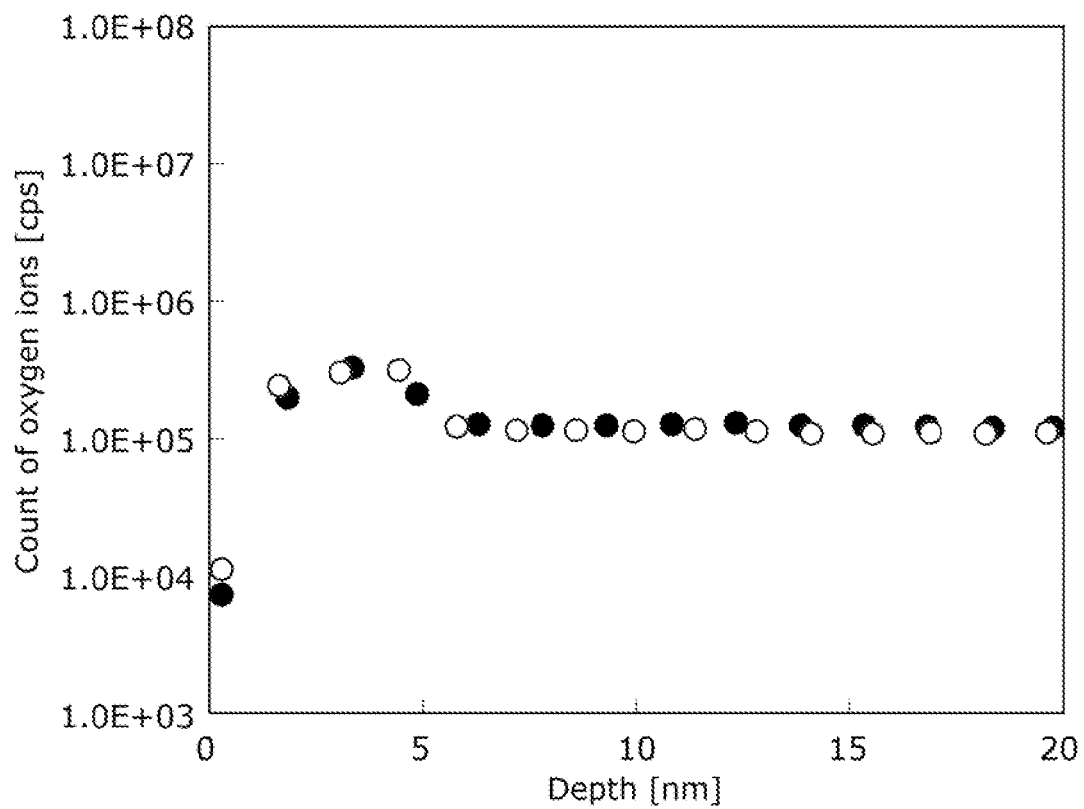
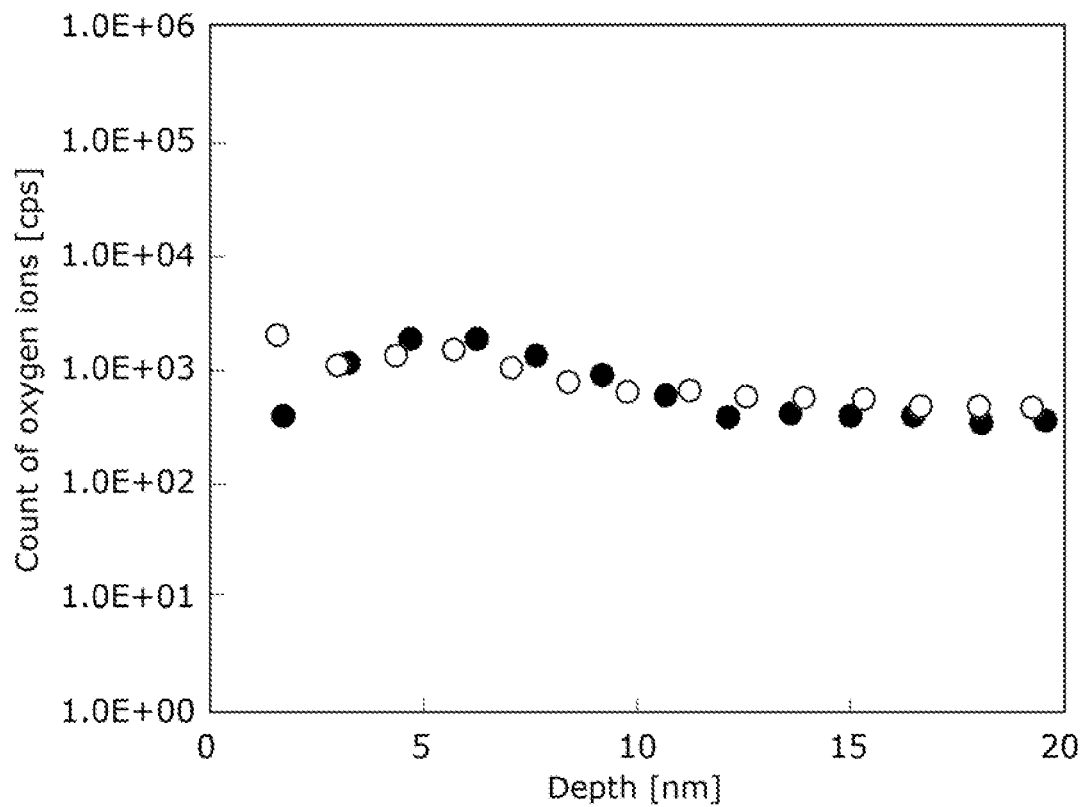

US 8,921,200 B2

NONVOLATILE STORAGE ELEMENT AND METHOD OF MANUFACTURING THEREOF

TECHNICAL FIELD

The present invention relates to a variable resistance nonvolatile memory element and a method of manufacturing the same.

BACKGROUND ART

In recent years, variable resistance nonvolatile memory elements made using, as a storage material, a variable resistance material including a transition metal oxide which is oxygen-deficient compared to a transition metal oxide having stoichiometric composition have been proposed. Such a nonvolatile memory element includes an upper electrode layer, a lower electrode layer, and a variable resistance layer between the upper electrode layer and the lower electrode layer. Resistance of the variable resistance layer reversibly changes upon application of an electrical pulse between the upper electrode layer and the lower electrode layer. Information can be stored in the nonvolatile memory element in a non-volatile manner by associating the information with the values of the resistance (see Japanese Unexamined Patent Application Publication No. 2007-235139, for example). Such variable resistance nonvolatile memory elements are expected to be small and fast and consume a small amount of power compared to flash memories having floating gates.

However, there is a problem that the conventional variable resistance nonvolatile memory elements have characteristics which vary more widely than an expectation based on thickness and composition of variable resistance layers and electrodes and dimensions and configurations of photoresist masks after lithography or configurations of variable resistance layers and electrodes after dry etching. This leads to a problem that a larger-size nonvolatile memory device has poor retention or inappropriately changes in resistance in bits having the poorest characteristics (tail bits) due to variation among nonvolatile memory elements.

SUMMARY OF INVENTION

Conceived to address the problems, the present invention has an object of providing variable resistance nonvolatile memory elements with less variation in characteristics thereamong and a method of manufacturing the variable resistance nonvolatile memory elements.

In order to achieve the above-described object, provided is a method of manufacturing a nonvolatile memory element according to an embodiment of the present invention which includes: forming a lower electrode layer above a substrate; forming, on the lower electrode layer, a variable resistance layer including an oxygen-deficient transition metal oxide; forming an upper electrode layer on the variable resistance layer; and forming a patterned mask on the upper electrode layer and etching the upper electrode layer, the variable resistance layer, and the lower electrode layer using the patterned mask, wherein in the etching, at least the variable resistance layer is etched using an etching gas containing bromine.

The present invention provides variable resistance nonvolatile memory elements with less variation in characteristics thereamong and a method of manufacturing the nonvolatile memory elements.

BRIEF DESCRIPTION OF DRAWINGS

FIG. 3B illustrates advantageous effects of the nonvolatile memory element according to the embodiment of the present invention.

FIG. 4 shows conditions for analyses using XPS in FIG. 3A and FIG. 3B.

FIG. 5A illustrates advantageous effects of the nonvolatile memory element according to the embodiment of the present invention.

FIG. 9 shows concentration distributions of oxygen in a thin film of $TaO_x$ against depth measured using SIMS before and after dry-etching treatment using a mixed gas of $C_5F_8$, $O_2$, and Ar.

FIG. 10 shows concentration distributions of carbon in a thin film of $TaO_x$ against depth measured using SIMS before and after dry-etching treatment using a mixed gas of $C_5F_8$, $O_2$, and Ar.

DESCRIPTION OF EMBODIMENTS

Figure 1A:
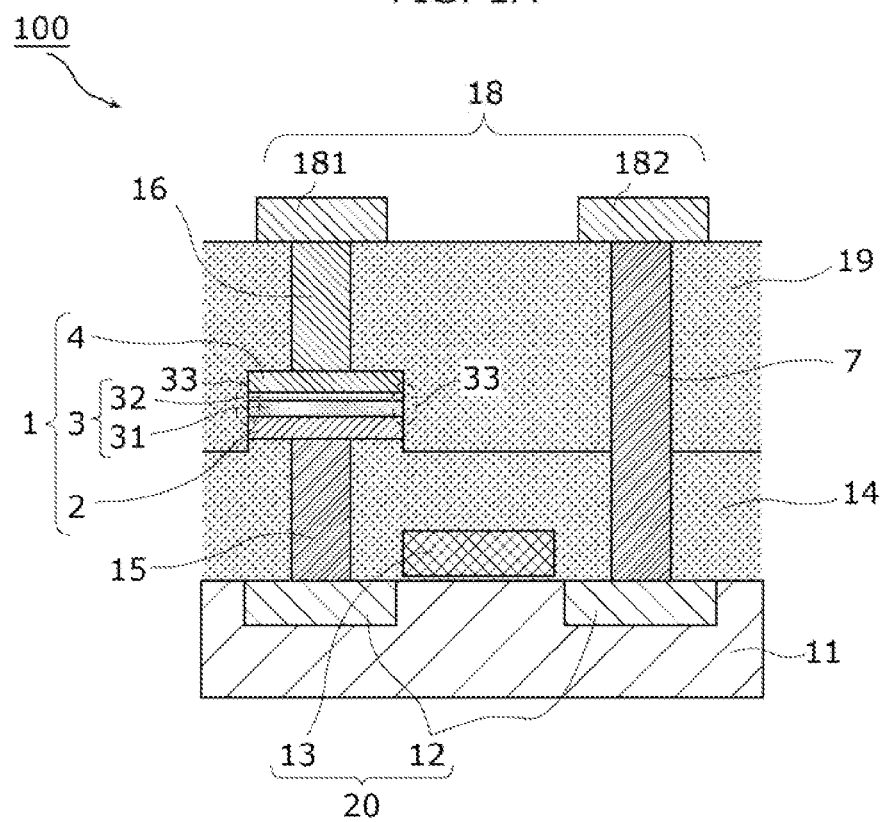
FIG. 1A is a cross-sectional view illustrating a configuration of a nonvolatile memory element according to an embodiment of the present invention.

A method of manufacturing a nonvolatile memory element in an embodiment of the present invention includes: forming a lower electrode layer above a substrate; forming, on the lower electrode layer, a variable resistance layer including an oxygen-deficient transition metal oxide; forming an upper electrode layer on the variable resistance layer; and forming a patterned mask on the upper electrode layer and etching the upper electrode layer, the variable resistance layer, and the lower electrode layer using the patterned mask, wherein in the etching, at least the variable resistance layer is etched using an etching gas containing bromine.

Here, for example, in the etching, the etching gas may contain hydrogen bromide.

By using this method, variable resistance nonvolatile memory elements with less variation in characteristics thereamong are provided. More specifically, etched end faces of the variable resistance layer have a product of a bromine compound attached thereto formed as a result of reaction with bromine. The bromine derives in decomposition in the etching plasma. The product of a bromine compound thus attached to the etched end faces reduces deoxidation of the etched end faces and impurity implantation into the etched end faces due to etching gas. This leads to reduction of damage to the variable resistance layer during the etching. Variation in characteristics among nonvolatile memory elements is thus reduced, so that the nonvolatile memory elements have initial resistance and operation characteristics with less variation thereamong, and thus prove to be quality nonvolatile memory elements with very little variation in characteristics.

Furthermore, hydrogen bromide, which is relatively a stable gas, is responsive to oxides so poorly that etching using hydrogen bromide progresses at a low rate. In this case, a variable resistance layer of a metal oxide is not etched. In other words, hydrogen bromide gas does not damage the variable resistance layer but only contributes to protection of etched end faces. Note that hydrogen bromide gas is commonly used in general semiconductor processing.

It is therefore possible to manufacture the variable resistance nonvolatile memory elements using semiconductor processing including a conventional CMOS process. This means that the present invention can be adapted to semiconductor processing for finer design rules.

The inventors have conceived the present invention through elaborate studies, in which the inventors found that variation in characteristics found in conventional manufacturing methods were due to damage during etching.

More specifically, in the step of dry etching to form a variable resistance element in the conventional manufacturing method, etched end faces of the target object are damaged by dry etching. Here, the damage during etching means, for example, deoxidation of an oxide as a result of reduction by dry etching using an etching gas. This leads to change in resistance of etched end faces of the oxide. The damage during etching also means that implantation of an impurity, namely, fluorine into etched end faces of an oxide during dry etching using a mixed gas containing fluorine-containing gas as an etching gas. This also leads to change in resistance of etched end faces of the oxide.

Thus, when a variable resistance layer including a metal oxide is patterned by dry etching, etched end faces of the variable resistance layer are damaged by deoxidation or impurity implantation during the etching, so that the resistance of the variable resistance layer changes. When a variable resistance element includes a variable resistance region including such an etched end face damaged during etching, the variable resistance element malfunctions due to deoxidation or impurity implantation.

This is the cause of malfunctions of conventional variable resistance nonvolatile memory elements, such as poor retention and inappropriate change in resistance in tail bits when the nonvolatile memory elements have larger capacity. The present invention has been conceived based on the foregoing underlying knowledge.

Furthermore, to achieve the above-described object, in the forming of the variable resistance layer, in the method of manufacturing a nonvolatile memory element in an aspect of the present invention, the variable resistance layer is formed to include a transition metal oxide having resistance which is variable according to an oxygen amount in the transition metal oxide, the resistance being increased by incorporation of an impurity in the variable resistance layer.

Here, for example, in the forming of the variable resistance layer, the variable resistance layer may be formed to include a transition metal oxide having resistance which is increased by incorporation of fluorine in the variable resistance layer.

Furthermore, for example, in the etching, the etching gas may further include fluorine.

Furthermore, for example, in the etching, a bromine compound may be attached at least to an etched end face of the variable resistance layer while the variable resistance layer is being etched.

Furthermore, for example, the forming of the variable resistance layer may include: forming, on the lower electrode layer, a first variable resistance layer including a transition metal oxide; and forming, on the first variable resistance layer, a second variable resistance layer including a transition metal oxide having a degree of oxygen deficiency lower than a degree of oxygen deficiency of the first variable resistance layer.

By using this method, a conduction path (filament) is formed which causes change in resistance in the second variable resistance layer in contact with the upper electrode layer. When the etched end face of the variable resistance layer is protected by a product of a bromine compound formed using a mixed gas containing a bromine compound as an etching gas, damage to the etched end face during etching such as deoxidation and impurity implantation can be reduced. This reduces variation in resistance among nonvolatile memory elements, and the nonvolatile memory elements stably operate even when a filament is formed near the etched end face.

Furthermore, for example, in the forming of the variable resistance layer, the variable resistance layer may be formed to include a transition metal oxide having resistance which increases with a decrease in a degree of oxygen deficiency of the variable resistance layer, or the variable resistance layer may be formed to include a metal oxide which is a tantalum oxide expressed as $TaO_x$ where $0<x<2.5$.

With this, the nonvolatile memory elements are capable of not only operating fast but also allowing stable reversible rewriting to tail bits as well and have favorable retention characteristics.

Furthermore, for example, in the forming of the variable resistance layer, the upper electrode layer may be formed to include one of platinum, iridium, and palladium.

In this configuration, variable resistance nonvolatile memory elements with less variation in characteristics thereamong are provided. Furthermore, in order to achieve the above-described object, provided is a nonvolatile memory element according to an aspect of the present invention which includes: a lower electrode layer formed above a substrate; a variable resistance layer formed on the lower electrode layer and including an oxygen-deficient transition metal oxide; and an upper electrode layer formed on the variable resistance layer, wherein the variable resistance layer has a side face with a bromine compound attached thereto.

Furthermore, for example, the side face of the variable resistance layer may have a sidewall protection film thereon including the bromine compound.

Thus, according to the above-described embodiment, the variable resistance nonvolatile memory elements having less variation in characteristics thereamong and a method of manufacturing the nonvolatile memory elements are provided.

For example, in the method of manufacturing a nonvolatile memory element etched end faces of the variable resistance layer have a product of a bromine compound attached thereto formed as a result of reaction with bromine. The bromine derives in decomposition in the etching plasma. The product of a bromine compound thus attached to the etched end faces reduces deoxidation of the etched end faces and impurity implantation into the etched end faces due to etching gas. This leads to reduction of damage to the variable resistance layer during the etching, so that variation in characteristics among nonvolatile memory elements can be reduced. Larger-capacity nonvolatile memory elements thus manufactured have initial resistance and operation characteristics with less variation thereamong, and prove to be quality nonvolatile memory elements with favorable retention characteristics.

Note that such variable resistance nonvolatile memory element is applicable to a large-scale semiconductor integrated circuit with all or part of such functionality.

Hereinafter, an embodiment of the present invention is described with reference to drawings. Each of the exemplary embodiments described below shows a general or specific example of the present invention. The values, materials, constituent elements, layout and connection of the constituent elements, steps, and the order of the steps in the embodiments are given not for limiting the present invention but merely for illustrative purposes only. Thus, among the constituent elements in the following embodiments, a constituent element not included in the independent claim reciting the most generic part of the concept of the present invention shall be described as a constituent element of a preferable embodiment.

A method of manufacturing a nonvolatile memory element according to an embodiment of the present invention is described below with reference to the drawings. Note that description of elements denoted by the same reference signs may be omitted. Also note that the drawings show constituent elements schematically for the sake of clarity, and therefore the shapes thereof are not correct and the number of the constituent elements is for simplicity of illustration.

Embodiment

Figure 1B:
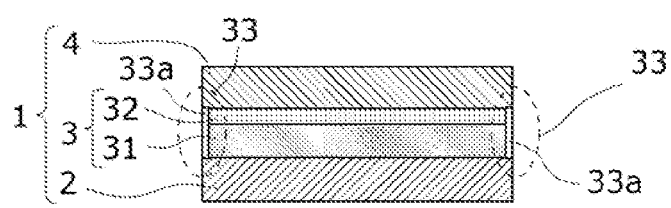
FIG. 1B is an enlarged sectional view illustrating a configuration of the variable resistance element according to the embodiment of the present invention.

FIG. 1A is a cross-sectional view illustrating a configuration of a nonvolatile memory element according to an embodiment of the present invention. FIG. 1A shows an example of a single nonvolatile memory element 100. FIG. 1B is a cross-sectional view illustrating a configuration of the side faces of a variable resistance element according to an embodiment of the present invention.

The nonvolatile memory element 100 shown in FIG. 1A includes: a variable resistance element 1, a substrate 11, a source-and-drain layer 12, a gate 13, a first interlayer dielectric 14, a first contact 15, a second contact 16, a third contact 7, patterned wiring 18, and a second interlayer dielectric 19. The variable resistance element 1 includes: a lower electrode layer 2, a variable resistance layer 3, and an upper electrode layer 4. The variable resistance layer 3 includes a first variable resistance layer 31 and a second variable resistance layer 32.

The gate 13 is formed above the substrate 11 with a gate dielectric formed between the gate 13 and the substrate 11.

The source-and-drain layer 12 is formed in the substrate 11.

The first interlayer dielectric 14 is formed on the substrate 11 to cover the gate 13 and the source-and-drain layer 12. The first interlayer dielectric 14 may be a film of plasma TEOS or $SiO_2$.

The substrate 11, the gate 13, the gate dielectric, and the source-and-drain layer 12 compose a transistor 20.

The first contact 15 is formed to penetrate through the first interlayer dielectric 14 to connect to one of the source and the drain in the source-and-drain layer 12 and the lower electrode layer 2 of the variable resistance element 1. The first contact 15 includes, for example, tungsten or copper.

The variable resistance element 1 is formed on the first interlayer dielectric 14 and the first contact 15. More specifically, the lower electrode layer 2 is formed on the first contact 15 to connect to the first contact 15. The first variable resistance layer 31 is formed on the lower electrode layer 2 and includes a first transition metal oxide. The second variable resistance layer 32 is formed on the first variable resistance layer 31 and includes a second transition metal oxide having a degree of oxygen deficiency lower than the degree of oxygen deficiency of the first oxide layer 31. The first variable resistance layer 31 and the second variable resistance layer 32 thus form a layered structure which is the variable resistance layer 3 of the variable resistance element 1. The upper electrode layer 4 is formed on the second variable resistance layer 32. The first variable resistance layer 31 has a thickness on the order of, for example, 20 nm to 100 nm inclusive. The second variable resistance layer 32 has a thickness on the order of, for example, 1 nm to 10 nm inclusive.

As shown in FIG. 1B, the variable resistance element 1 has sidewall protection films 33a on the side faces of the variable resistance layer 3 (etched end face 33). The sidewall protection films 33a are formed of a bromine compound attached to the etched end face 33.

Here, the first variable resistance layer 31 is a first transition metal oxide layer including an oxygen-deficient transition metal oxide. The second variable resistance layer 32 is a second transition metal oxide layer including a transition metal oxide having a degree of oxygen deficiency lower than the degree of oxygen deficiency of the first transition metal oxide layer. In the present embodiment, for example, a first transition metal included in the first transition metal oxide layer and a second transition metal included in the second transition metal oxide layer are of the same transition metal. More specifically, the first variable resistance layer 31 is an oxygen-deficient first tantalum oxide layer ($TaO_x$), and the second variable resistance layer 32 is a second tantalum oxide layer ($TaO_y$). For $TaO_x$ of the first tantalum oxide layer, x satisfies $0<x<2.5$, and for $TaO_y$ of the second tantalum oxide layer, y satisfies $x<y$. Furthermore, for $TaO_x$ of the first tantalum oxide layer, x preferably satisfies $0.8 \leq x \leq 1.9$, and for $TaO_y$ of the second tantalum oxide layer, y preferably satisfies $2.1 \leq y$.

Note that the oxygen-deficient transition metal oxide is a transition metal oxide deficient in oxygen compared to stoichiometric composition. A nonvolatile memory element including a layered structure of $TaO_x$ ($0.8 \leq x \leq 1.9$) and $TaO_y$ ($2.1 \leq y$) will operate fast, so that the nonvolatile memory element characteristically allows stable reversible rewriting. Also note that the degree of oxygen deficiency of a transition metal oxide refers to a rate of deficiency in oxygen to stoichiometric composition of the transition metal oxide. Generally, an oxide of stoichiometric composition has characteristics of an electrical insulator, and an oxygen-deficient transition metal oxide has characteristics of an electrical conductor.

The second variable resistance layer 32 preferably has a degree of oxygen deficiency lower than the degree of oxygen deficiency of the first variable resistance layer 31, and thus has a resistance higher than the resistance of the first variable resistance layer 31. In this configuration, voltage applied between the upper electrode layer 4 and the lower electrode layer 2 to change resistance is distributed more to the second variable resistance layer 32 than to the first variable resistance layer 31, so that oxidation-reduction reactions are likely to occur more in the second variable resistance layer 32. Here, the material of the first transition metal included in the first variable resistance layer 31 and the material of the second transition metal included in the second variable resistance layer 32 may be either the same or different. Examples of a transition metal to be included in the first metal oxide layer include tantalum (Ta), titanium (Ti), hafnium (Hf), zirconium (Zr), niobium (Nb), and tungsten (W). Since transition metals exhibit two or more oxidation states, the resistance state of a transition metal can be changed in oxidation-reduction reaction. Furthermore, when the material of the first transition metal and the material of the second transition metal are different, it is preferable that the second transition metal has a standard electrode potential lower than the standard electrode potential of the first transition metal. This is because resistance change is caused by change in high resistance of a minute filament formed in the second variable resistance layer 32 due to oxidation-reduction reactions therein. A material having a higher standard electrode potential has a characteristic that the material is less susceptible to oxidation. When oxidation-reduction reactions occurs more in the second transition metal than in the first transition metal, the nonvolatile memory element is expected to operate more stably.

For example, when the first variable resistance layer 31 includes the first tantalum oxide layer $TaO_x$ ($0.8 \leq x \leq 1.9$), the first variable resistance layer 312 preferably has a thickness of 45 nm. When the second variable resistance layer 32 includes the second tantalum oxide layer $TaO_y$ ($2.1 \leq y$), the second variable resistance layer 32 preferably has a thickness of 5 nm.

Note that the functions and effects according to the present invention are also present when tantalum oxide is used as a material of a variable resistance layer, and the present invention is not limited to the foregoing example in which tantalum oxide is used. For example, the layered structure may include layers of oxides of hafnium (Hf) or layers of oxides of zirconium (Zr).

For example, assume that the layered structure includes layers of hafnium oxides. For a first hafnium oxide expressed by composition formula of $HfO_x$, x preferably satisfies $0.9 \leq x \leq 1.6$, and for a second hafnium oxide expressed by a composition formula of $HfO_y$, y preferably satisfies $1.8 < y$. For example, assume that the layered structure includes layers of zirconium oxides. For a first zirconium oxide expressed by composition formula of $ZrO_x$, x preferably satisfies $0.9 \leq x \leq 1.4$, and for the second zirconium oxide expressed by a composition formula of $ZrO_y$, y preferably satisfies $1.9 < y$.

The upper electrode layer 4 preferably has a thickness of 50 nm. The upper electrode layer 4 includes a simple metal or an alloy having a standard electrode potential higher than the standard electrode potential of the transition metal included in the variable resistance layer 3, and may have either a single-layered structure or a multiple-layered structure. Here, the metal having a standard electrode potential higher than the standard electrode potential of the transition metal included in the variable resistance layer 3 is preferably a noble metal such as platinum (Pt), iridium (Ir), or palladium (Pd).

When the material of the variable resistance layer 3 is an oxygen-deficient transition metal oxide, the material of the upper electrode layer 4 is such that the upper electrode layer 4 has a standard electrode potential higher than the standard electrode potential of the transition metal of the oxygen-deficient transition metal oxide and that the lower electrode layer 2 has a standard electrode potential lower than the standard electrode potential of the upper electrode layer 4. Thus, at the interface between the electrode having a higher standard electrode potential (upper electrode layer 4) and the variable resistance layer 3, oxidation-reduction reactions occur preferentially in the variable resistance layer 3 according to applied voltage, and a high-oxygen variable resistance layer and a low-oxygen variable resistance layer are thereby formed. The nonvolatile memory element 100 thus obtained stably operates. Specifically, when the oxygen-deficient transition metal oxide is a tantalum oxide, the electrode material having a higher standard electrode potential (for example, Pt, Ir, or Pd) is used as a material of the electrode in contact with the second tantalum oxide layer having a lower degree of oxygen deficiency, and the electrode material having a lower standard electrode potential (for example, tantalum (Ta), tantalum nitride (TaN), or titanium (Ti)) is used as a material of the electrode in contact with the first tantalum oxide layer having a higher degree of oxygen deficiency.

The second interlayer dielectric 19 is formed to cover the side faces of the lower electrode layer 2, the side faces of the first variable resistance layer 31, and the side faces of the second variable resistance layer 32 and the side faces and top face of the upper electrode layer 4.

The second contact 16 is formed to penetrate through the second interlayer dielectric 19 to reach the upper electrode layer 4. The third contact 7 is formed to penetrate through the second interlayer dielectric 19 and the first interlayer dielectric 14 to reach one of the source and the drain in the source-and-drain layer 12. As with the first contact 15, the second contact 16 and the third contact 7 includes, for example, tungsten or copper.

The patterned wiring 18 is formed on the top face of the second interlayer dielectric 19 and includes first patterned wiring 181 and second patterned wiring 182 connecting to the second contact 16 and the third contact 7, respectively. More specifically, the second contact 16 connects the upper electrode layer 4 of the variable resistance element 1 to the first patterned wiring 181, and the third contact 7 connects the one of the source and the drain in the source-and-drain layer 12 to the second patterned wiring 182. The patterned wiring 18 includes, for example, copper or an aluminum alloy.

The nonvolatile memory element 100 is thus configured.

Figure 7:
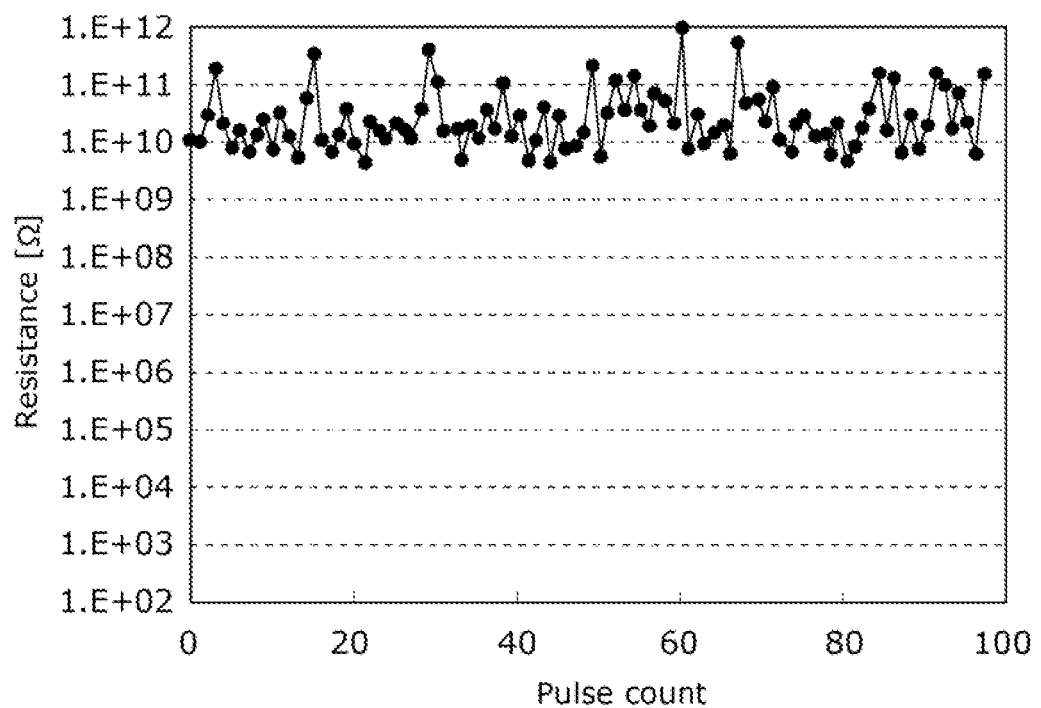
FIG. 7 illustrates a state of the nonvolatile memory element remaining in a high resistance state.

However, the nonvolatile memory element 100 shown in FIG. 1A may deteriorate in resistance change characteristics as shown in FIG. 7. FIG. 7 shows that the variable resistance element remains in a high resistance state and fails to change to a low resistance state despite alternate applications of a pulse for high resistance writing and a pulse for low resistance writing. The inventors investigated the cause of the deterioration in resistance change characteristics, and considered that this was caused by change in composition of the variable resistance layer due to radical fluorine, which is included in plasma of an etching gas, incorporated into the variable resistance layer while the variable resistance layer is exposed to the etching gas containing a gaseous fluorine compound in the process of dry etching. The same may apply to oxygen-deficient transition metal oxides having resistance change characteristics.

The inventors carried out the following experiment to examine effects of an etching gas containing a gaseous fluorine compound on film properties.

First, the inventors prepared samples each of which is a substrate with a tantalum oxide ($TaO_x$) deposited thereon, and analyzed the surface of the tantalum oxide by secondary ion mass spectrometry (SIMS).

Figure 8:
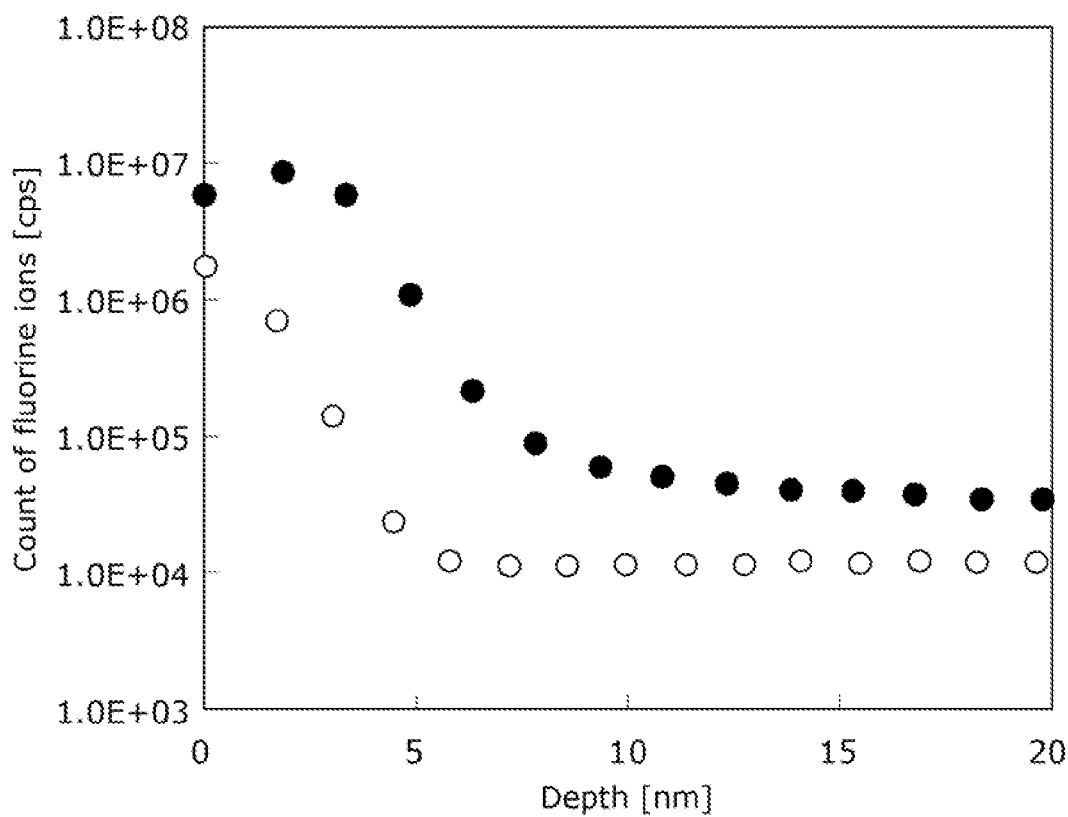
FIG. 8 shows concentration distributions of fluorine in a thin film of $TaO_x$ against depth measured using secondary ion mass spectrometry (SIMS) before and after dry-etching treatment using a mixed gas of $C_5F_8$, $O_2$, and Ar.

Next, the surface of the tantalum oxide was treated with dry etching using a mixed gas of $C_5F_8$, $O_2$, and Ar, and then analyzed using secondary ion mass spectrometry (SIMS). FIG. 8 shows concentration distributions of fluorine in the thin film of $TaO_x$ against depth measured using secondary ion mass spectrometry (SIMS) before and after the dry-etching treatment using the mixed gas of $C_5F_8$, $O_2$, and Ar.

The vertical axis indicates counts (cps) of fluorine ions, and the horizontal axis indicates the depth (nm) in the $TaO_x$ film from the surface thereof. The data of the measurement before the dry etching is plotted as blank circles, and the data of the measurement after the dry etching is plotted as solid circles. This result shows that fluorine was incorporated in the surface layer of the thin film of $TaO_x$ as a result of dry etching using fluorine-containing gas. The result also shows that judging from the half-value width, fluorine was incorporated in the region above a depth of 5 nm to the surface of the $TaO_x$ film. Use of other etching gases containing fluorine compounds, such as $CF_4$, $CHF_3$, and $SF_6$ yielded similar results. Fluorine ions were observed near the surface before the dry etching was performed as well. This is considered as fluorine incorporated in the surface layer of the $TaO_x$ film before the dry etching for any reason.

FIG. 9 and FIG. 10 respectively show concentration distributions of oxygen and carbon in the thin film of $TaO_x$ against depth before and after the dry-etching treatment using the mixed gas of $C_5F_8$, $O_2$, and Ar. These results show that oxygen and carbon were hardly incorporated in the surface layer of the $TaO_x$ film.

From the above results, it is derived that in order to avoid incorporation of fluorine near the surface of a variable resistance layer, a manufacturing method in which the variable resistance layer is not exposed to an etching gas containing a fluorine compound, a structure of a nonvolatile memory element such that the variable resistance layer therein is not exposed to an etching gas containing a fluorine compound, or an additional treatment to restore the original state of the deteriorated variable resistance layer after exposure to an etching gas containing a fluorine compound is necessary.

Use of an etching gas containing $BCl_3$ and $Cl_2$ prevents incorporation of fluorine into a variable resistance film. However, it has also been observed that use of the etching gas resulted in decrease of oxygen in the variable resistance film along with decrease in initial resistance and variation in resistance of the variable resistance film.

Conceived to address these problems, the present invention provides a method of manufacturing a nonvolatile memory element in which incorporation of fluorine into a variable resistance layer and decrease in oxygen in the variable resistance layer are prevented.

The method of manufacturing the nonvolatile memory element 100 according to the present invention will be described below.

FIGS. 2A to 2H are cross-sectional views illustrating steps of the method of manufacturing the nonvolatile memory element 100 according to the embodiment of the present invention. In practice, the substrate 11 has a large number of nonvolatile memory elements formed thereon. These drawings show a single nonvolatile memory element thereon for simplicity of illustration. In addition, each of the drawings shows an enlarged view of the nonvolatile memory element for easy understanding.

Figure 2A:
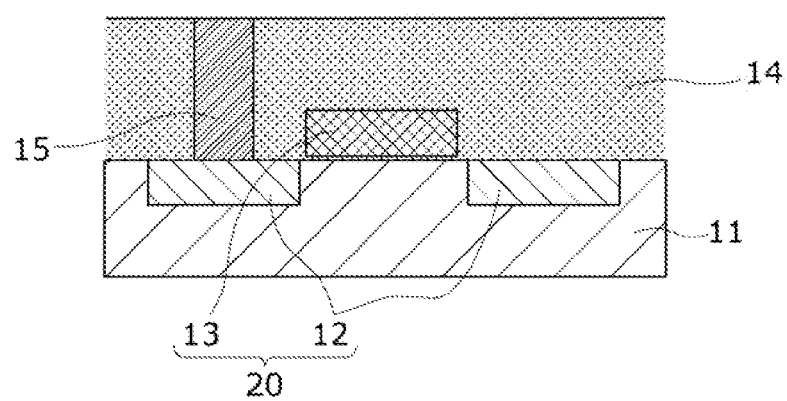
FIG. 2A is a cross-sectional view illustrating a step of a method of manufacturing the nonvolatile memory element according to the embodiment of the present invention.

First, in the step shown in FIG. 2A, the source-and-drain layer 12 is formed in the substrate 11, and the gate 13 is formed above the substrate 11. Next, the first interlayer dielectric 14 which is a film of plasma TEOS or $SiO_2$ is formed. Next, the first contact 15 is formed to penetrate the first interlayer dielectric 14 to connect to one of the source and the drain in the source-and-drain layer 12.

Figure 2B:
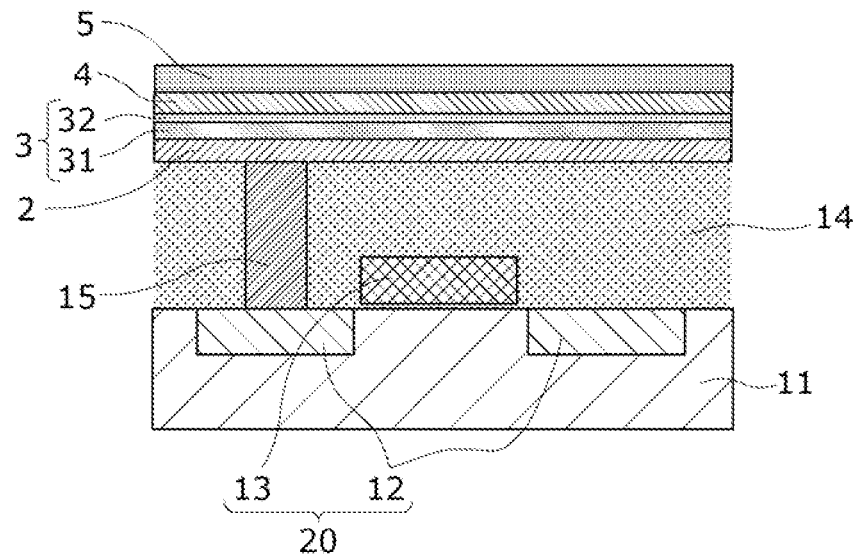
FIG. 2B is a cross-sectional view illustrating a step of the method of manufacturing the nonvolatile memory element according to the embodiment of the present invention.

Next, in the step shown in FIG. 2B, the lower electrode layer 2, the first variable resistance layer 31, the second variable resistance layer 32, and the upper electrode layer 4 are formed in this order above the first interlayer dielectric 14 to cover the exposed top face of the first contact 15, and then the hard mask layer 5 is formed to cover the top face of the upper electrode layer 4.

Note that hereinafter, the lower electrode layer 2, the variable resistance layer 3, the first variable resistance layer 31, the second variable resistance layer 32, the upper electrode layer 4, and the hard mask layer 5 may be either in a state where they are etched in a pattern or in a state where they are each in the form of a film.

More specifically, the lower electrode layer 2 of TaN having a thickness of 30 nm is formed on the first interlayer dielectric 14. Next, the first variable resistance layer 31 of an oxygen-deficient tantalum oxide $TaO_x$ (here, x=1.56) having a thickness of 30 nm is formed on the lower electrode layer 2, and then the second variable resistance layer 32 of $TaO_y$ (here, y=2.48) having a thickness of 5 nm is formed high as on the first variable resistance layer 31. The tantalum oxide $TaO_y$ has a degree of oxygen deficiency lower than the degree of oxygen deficiency of the $TaO_x$. Next, the upper electrode layer 4 of iridium (Ir) having a thickness of 80 nm is formed on the second variable resistance layer 32, and then the hard mask layer 5 of TiAlN having a thickness of 100 nm is formed on the top face of the upper electrode layer 4.

Here, the first variable resistance layer 31 is deposited by reactive sputtering using metal tantalum as a sputtering target under an argon atmosphere containing oxygen. Subsequently, the second variable resistance layer 32 is formed on the first variable resistance layer 31 by plasma-oxidizing the top face of the first variable resistance layer 31 under an oxygen atmosphere, so that the second variable resistance layer 32 has a degree of oxygen deficiency lower than the degree of oxygen deficiency of the first variable resistance layer 31. More specifically, $TaO_x$ is deposited to form the 35-nm thick first variable resistance layer 31, and then the top face of $TaO_x$ deposited is oxidized by plasma-oxidizing under an oxygen atmosphere to form, on the first variable resistance layer 31 of $TaO_x$, the 5-nm thick second variable resistance layer 32 of $TaO_y$ having a degree of oxygen deficiency lower than the degree of oxygen deficiency of $TaO_x$. The method of oxidization is not limited to plasma-oxidizing and may be performed by a treatment having an oxidation effect on a surface, such as a heat treatment under an oxygen atmosphere. Alternatively, instead of the oxidization, $TaO_y$ may be deposited to form the 5-nm thick second variable resistance layer 32 by reactive sputtering after the depositing of a 30-nm thick $TaO_x$ layer. Reactive sputtering allows for adjustment of the degree of oxygen deficiency of a layer by changing the oxygen level of an atmosphere for sputtering or using a transition metal oxide as a sputtering target $TaO_y$ may be deposited using, as a sputtering target, metal tantalum or a tantalum oxide (for example, $Ta_2O_5$).

Figure 2C:
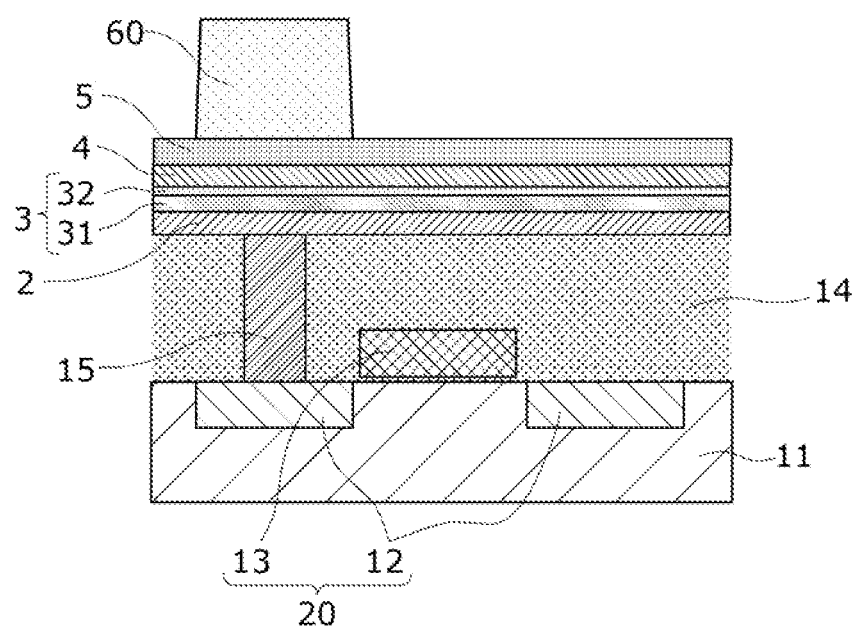
FIG. 2C is a cross-sectional view illustrating a step of the method of manufacturing the nonvolatile memory element according to the embodiment of the present invention.

Next, in the step shown in FIG. 2C, a pattern of photoresist mask 60 is formed by exposure and developing.

Figure 2D:
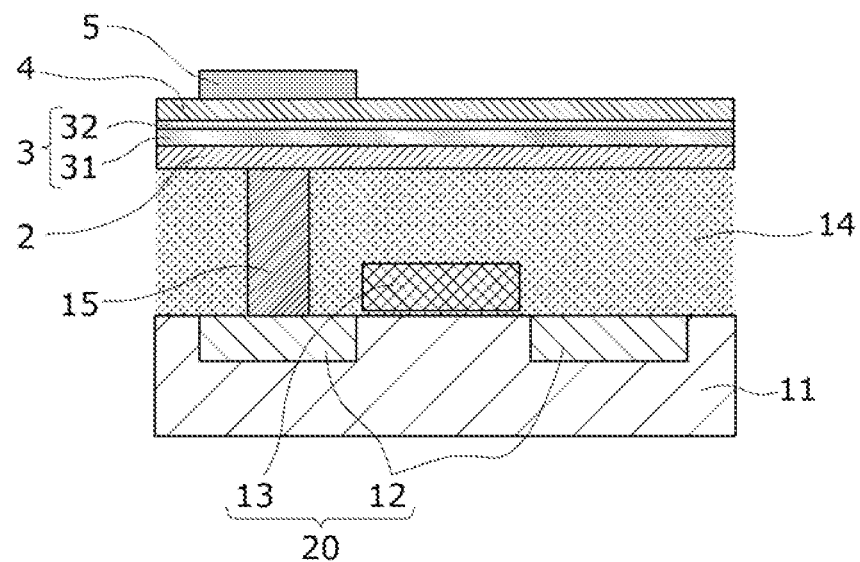
FIG. 2D is a cross-sectional view illustrating a step of the method of manufacturing the nonvolatile memory element according to the embodiment of the present invention.

Next, in the step shown in FIG. 2D, a pattern of the hard mask layer 5 including, for example, TiAlN is formed by dry etching.

Figure 2E:
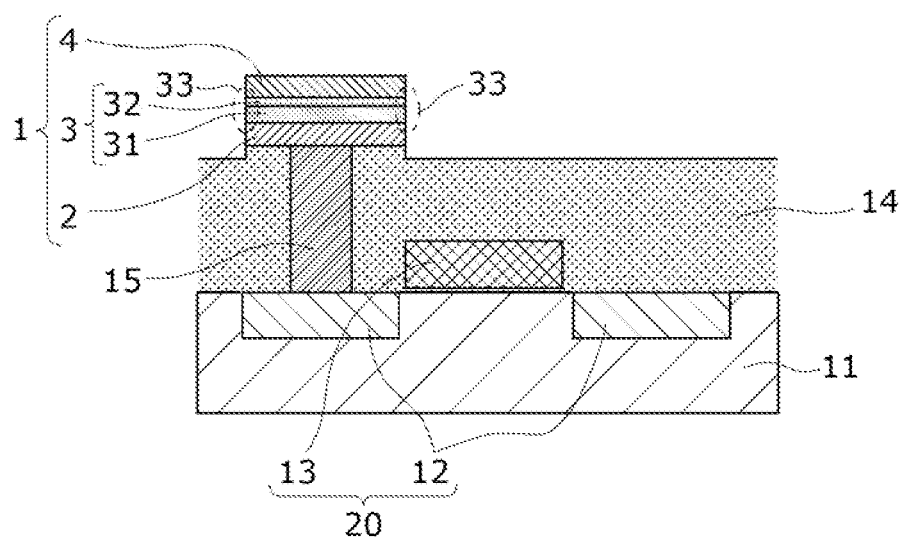
FIG. 2E is a cross-sectional view illustrating a step of the method of manufacturing the nonvolatile memory element according to the embodiment of the present invention.

Next, in the step shown in FIG. 2E, the upper electrode layer 4, the variable resistance layer 3, and the lower electrode layer 2 are formed into a desired pattern by dry etching using a mixed gas containing bromine, and then the hard mask layer 5 is removed. The variable resistance element 1 is thus formed to include: the upper electrode layer 4, the variable resistance layer 3 including the second variable resistance layer 32 and the first variable resistance layer 31, and the lower electrode layer 2.

More specifically, first, the upper electrode layer 4 is etched by dry etching using a mixed gas containing, for example, $Cl_2$ and Ar and, as a mask, the hard mask layer 5 including a 100-nm thick film of TiAlN formed in the step of FIG. 2D. Next, the variable resistance layer 3 including a tantalum oxide is etched by dry etching using a mixed gas containing $SF_6$ and HBr (hydrogen bromide). Next, the lower electrode layer 2 including tantalum nitride is etched by dry etching using a mixed gas containing $Cl_2$ and Ar. Next, the hard mask layer 5 is removed by etching, so that the variable resistance element 1 is provided.

Here, in the dry etching performed as described above, the etching gas used at least for the patterning of the variable resistance layer 3 contains a bromine compound, which is preferably hydrogen bromide. Accordingly, the etched end faces 33 of the variable resistance layer 3 each have the sidewall protection film 33a including a product derived from a bromine compound. The sidewall protection films 33a are formed on the etched end faces 33 as a result of reaction thereof with bromine contained in the etching gas. The product derived from a bromine compound protects the variable resistance layer 3 against damage during the etching, such as deoxydation and impurity implantation caused by reaction with the etching gas.

The sidewall protection film 33a thus formed prevents the etched end face 33 of the variable resistance layer 3 from being damaged during the etching, so that variable resistance element 1 thus formed has less deterioration and less variation in characteristics.

A mixed gas containing a bromine compound may also be used as an etching gas in the process of dry etching to form a pattern of the upper electrode layer 4. This positively prevents the etched end faces 33 of the variable resistance layer 3 from being damaged during etching when the etched end faces 33 are exposed in the case where the upper electrode layer 4 is over-etched.

A mixed gas containing a bromine compound may also be used as an etching gas in the process of dry etching to form a pattern of the lower electrode layer 2. This prevents the etched end face 33 of the variable resistance layer 3 from being damaged during dry etching the lower electrode layer 2.

Furthermore, the step in which the hard mask layer 5 is removed is a non-limiting example. The hard mask layer 5 may be left without being removed. In this case, the second contact 16 is to be formed to penetrate the hard mask layer 5 as well to connect to the upper electrode layer 4. This step will be described later. When the hard mask layer 5 includes an electrically conductive material, the second contact 16 may be formed not to penetrate but to connect to the hard mask layer 5.

Figure 2F:
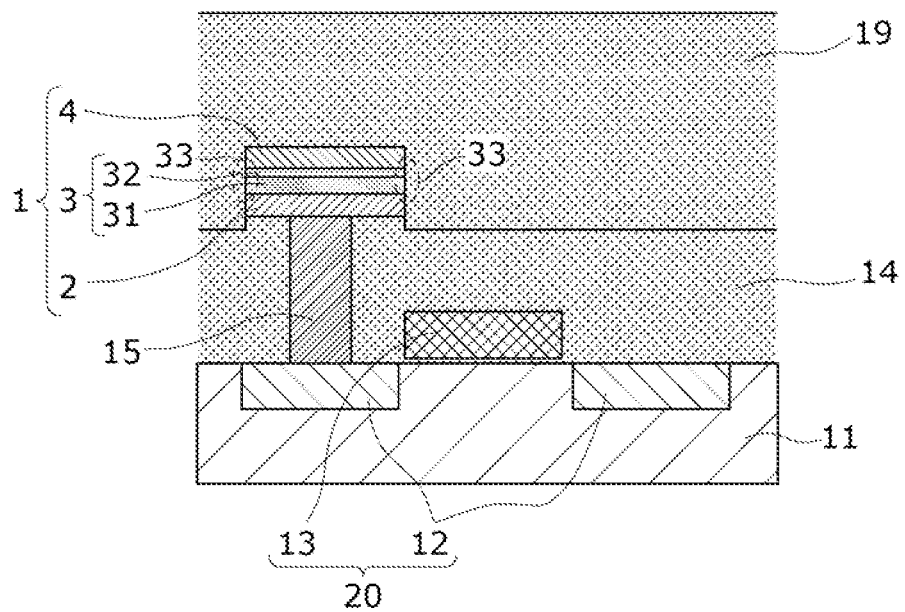
FIG. 2F is a cross-sectional view illustrating a step of the method of manufacturing the nonvolatile memory element according to the embodiment of the present invention.

Next, in the step shown in FIG. 2F, the second interlayer dielectric 19 is formed to cover the first interlayer dielectric 14, the upper electrode layer 4, the variable resistance layer 3, and the lower electrode layer 2.

Figure 2G:
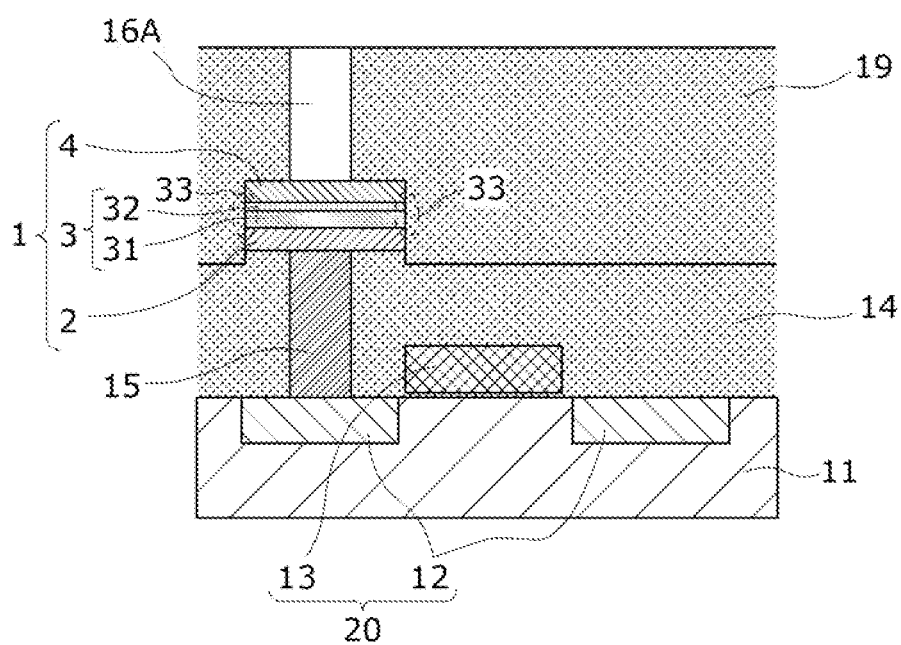
FIG. 2G is a cross-sectional view illustrating a step of the method of manufacturing the nonvolatile memory element according to the embodiment of the present invention.

Next, in the step shown in FIG. 2G, a second contact opening 16A is formed at the position where the second contact 16 is to be formed in the following step, to penetrate the second interlayer dielectric 19 to reach the upper electrode layer 4. The second contact 16 is to connect to the upper electrode layer 4 of the variable resistance element 1.

Figure 2H:
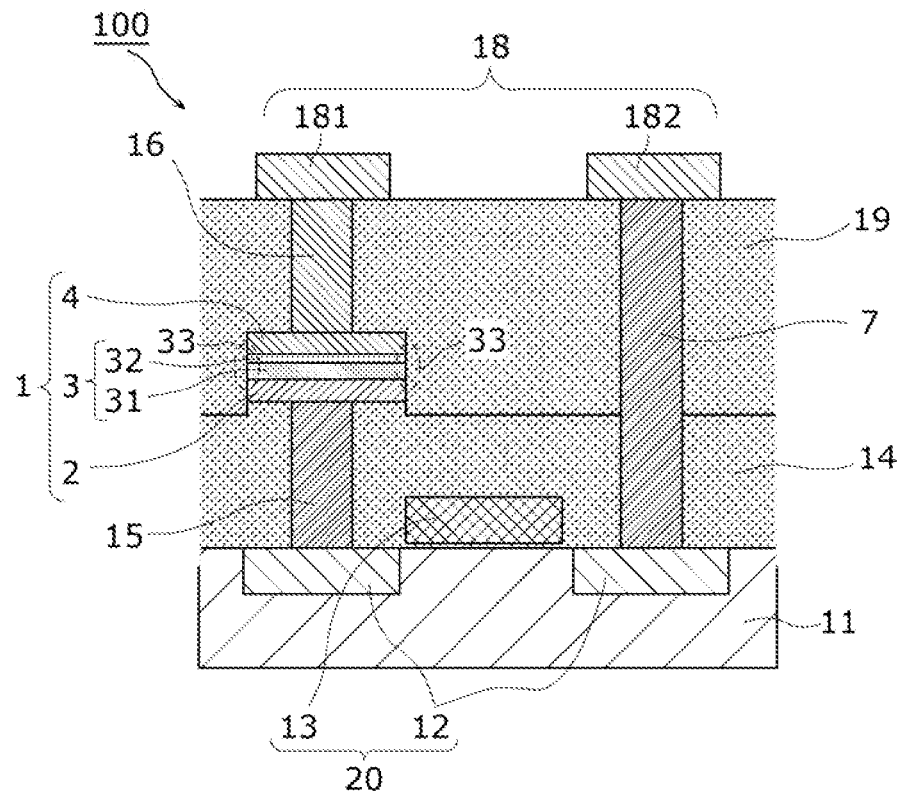
FIG. 2H is a cross-sectional view illustrating a step of the method of manufacturing the nonvolatile memory element according to the embodiment of the present invention.

Next, in the step shown in FIG. 2H, the second contact 16 is formed in the second contact opening 16A. Next, the third contact 7 is formed to penetrate the second interlayer dielectric 19 and the first interlayer dielectric 14 to connect to the other of the source and drain in the source-and-drain layer 12. Next, on the top face of the second interlayer dielectric 19, the first patterned wiring 181 is formed to connect the second contact 16 and the second patterned wiring 182 is formed to connect to the third contact 7.

The nonvolatile memory element 100 shown in FIG. 1 is thus made.

Nonvolatile memory elements with less variation in characteristics are thus made using the method in which the etching of the variable resistance layers of nonvolatile memory element 100 is performed using the above-described mixed gas containing bromine. The nonvolatile memory element 100 capable of stable operation may be implemented by providing the variable resistance element 1 as, for example, a nonvolatile memory element including one transistor per nonvolatile memory cell.

The nonvolatile memory element 100 thus made has the following advantageous effects.

Figure 3A:
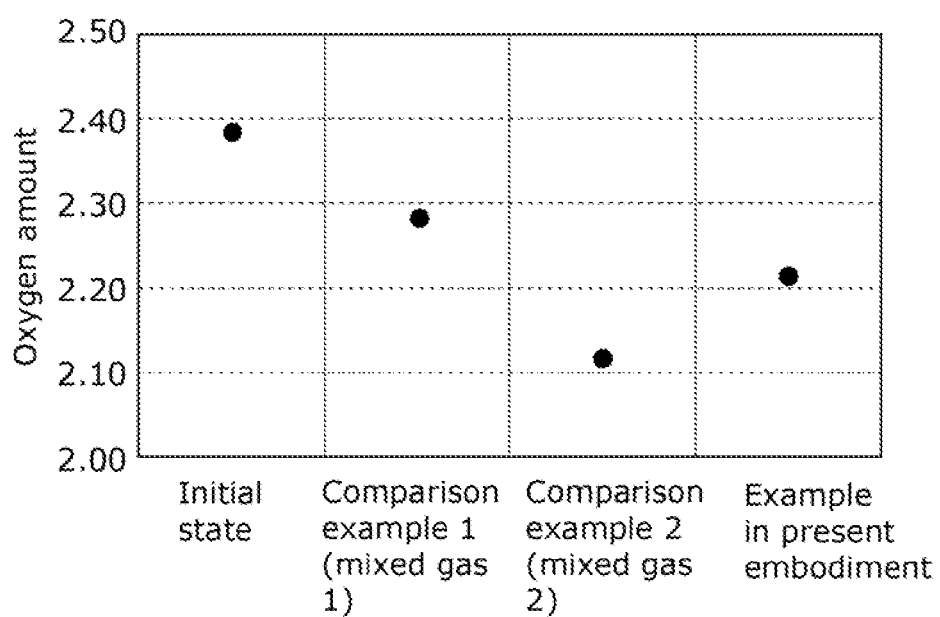
FIG. 3A illustrates advantageous effects of the nonvolatile memory element according to the embodiment of the present invention.

FIG. 3A and FIG. 3B illustrate advantageous effects of the nonvolatile memory element according to the embodiment of the present invention.

FIG. 3A and FIG. 3B show elemental composition of the $TaO_x$ surface of the first variable resistance layer 31 analyzed by X-ray photoelectron spectroscopy (XPS). Each of FIG. 3A and FIG. 3B includes a result of analysis of the $TaO_x$ surface etched using a mixed gas containing a bromine compound used in the present embodiment, for example, a mixed gas of HBr and $SF_6$ at a flow ratio of 1:1 and results of analysis in Comparison example 1 and Comparison example 2. In Comparison example 1, a $TaO_x$ surface was etched using a mixed gas 1, and in Comparison example 2, a $TaO_x$ surface was etched using a mixed gas 2. The mixed gas 1 and the mixed gas 2 included no bromine compound. FIG. 3A and FIG. 3B each also include a result of analysis of the $TaO_x$ surface of the first variable resistance layer 31 before being etched.

The mixed gas 1 includes gases of Ar, $Cl_2$, and $CHF_3$ at a flow ratio of 20:10:1. The mixed gas 2 includes gases of $BCl_3$ and $Cl_2$ at a flow ratio of 1:1.

FIG. 3A shows the results of measurement of oxygen amounts in the $TaO_x$ surface. FIG. 3B shows the results of measurement of impurity amounts (the amounts of fluorine, denoted as F amount in FIG. 3B) in the $TaO_x$ surface. Here, the impurity amount (the amount of fluorine) is the amount of fluorine among elements (impurities) other than tantalum and oxygen detected in XPS. In other words, the amount of an impurity (the amount of fluorine) means the amount of implanted fluorine. In FIG. 3A, the larger the decrease in the oxygen amount from the initial state is, the more the $TaO_x$ film is deoxidized by being damaged during etching. Similarly in FIG. 3B, the larger the amount of impurity (the amount of fluorine) is, the more the $TaO_x$ film is damaged by impurity implantation during etching. Note that XPS was performed under the conditions shown in FIG. 4.

FIG. 4 shows the conditions for the analysis using XPS shown in FIG. 3A and FIG. 3B. More specifically, XPS for the above-described analyses was performed under the conditions of a beam diameter of 100 m, an electron analyzer angle of 45 degrees, a pass energy of 23.5 V, a reference element peak of C1s (285.2 eV), and the source X-ray of AlK (1486.6 eV). Furthermore, the X-ray irradiation was performed on a spot, at a step size of 0.100 eV, using irradiation energy in HP mode, at a vacuum of $3.4 \times 10^{-9}$ Torr, without using a neutralization gun. The analyses using XPS was performed using Quantum 2000 made by ULVAC-PHI, Incorporated.

In the case of Comparison example 1, as shown in FIGS. 3A and 3B, decrease in the oxygen amount was reduced while the impurity amount (F amount) significantly increased. It is therefore possible that in dry etching using the mixed gas 1, the variable resistance layer was damaged by impurity implantation during the dry etching.

In the case of Comparison example 2, as shown in FIGS. 3A and 3B, the impurity amounts (F amount) were comparable while there was a significant decrease in the oxygen amount from the initial state. It is therefore possible that in dry etching using the mixed gas 2, the variable resistance layer was damaged by deoxidation during the dry etching.

In the case of the present embodiment where a mixed gas containing a bromine compound (in particular, hydrogen bromide), as shown in FIGS. 3A and 3B, there were a slight decrease in the oxygen amount and a slight increase in the impurity amount from the initial state. In comparison with Comparison example 2, the decrease in the oxygen amount was small. In comparison with Comparison example 1, the impurity amount was small. In other words, in the present embodiment, use of a mixed gas containing a bromine compound reduces decrease in the oxygen amount and increase in the amount of impurity, so that damage to the end face of the variable resistance layer during etching can be reduced.

Figure 5B:
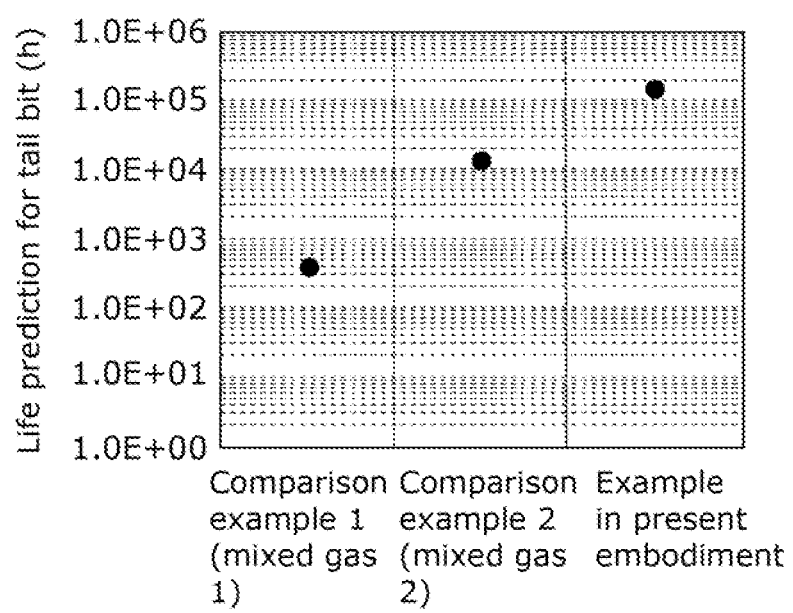
FIG. 5B illustrates advantageous effects of the nonvolatile memory element according to the embodiment of the present invention.
Figure 6:
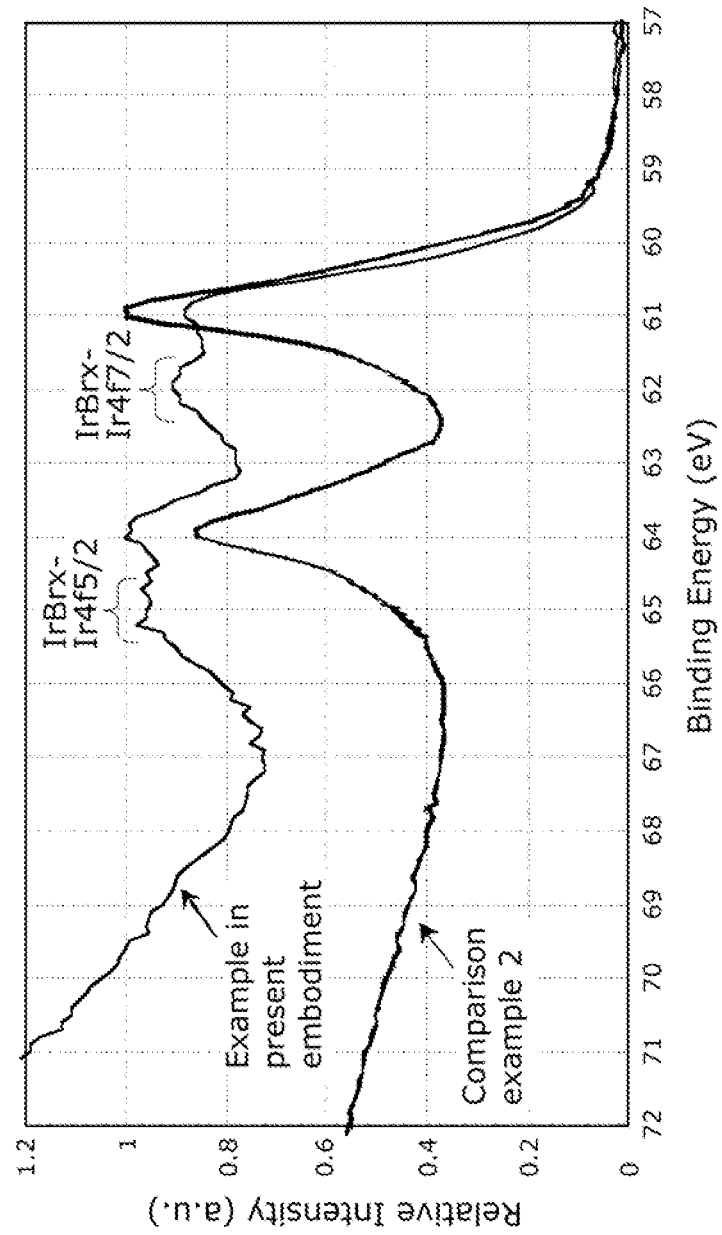
FIG. 6 illustrates advantageous effects of the nonvolatile memory element according to the embodiment of the present invention.

FIGS. 5A, 5B, and 6 illustrate advantageous effects of the nonvolatile memory element according to the embodiment of the present invention.

FIGS. 5A and 5B show characteristics of the nonvolatile memory element 100 made using the method in the present embodiment and characteristics of the nonvolatile memory elements made using the methods in above-described Comparison example 1 and Comparison example 2. FIG. 5A shows the number of malfunctioning bits among 256 kbits. FIG. 5B shows retention characteristics of tail bits at 85C. The retention characteristics (life prediction) were evaluated using the following method. First, for example, at each of the temperatures of 180 C, 150 C, and 125C, a length of time is calculated which is taken by the current value of the nonvolatile memory element in a low-resistance state to reach a reference value. Similarly, a length of time is calculated which is taken by the current value of the nonvolatile memory element in a high-resistance state to reach a reference value. The reference value is, for example, 50% of an initial current value. Next, activation energy is calculated from Arrhenius plot to determine a time taken to reach the reference value at a temperature of 85 C. The life time prediction (retention characteristics) is determined using the calculation results.

As shown in FIG. 5A, in Comparison example 1, the number of malfunctioning bits among 256 kbits was 103 bits, and in Comparison example 2, the number of malfunctioning bits among 256 kbits was 193 bits. In comparison, the number of malfunctioning bits among 256 kbits was 0 bits in the present embodiment, which shows that the nonvolatile memory element even having increased capacity included no malfunctioning bit.

Furthermore, as shown in FIG. 5B, the retention at 85 C is approximately 400 hours in Comparison example 1 and approximately 1.5 years (13000 hours) in Comparison example 2. In comparison, the retention at 85 C in the present embodiment is approximately 17 years (150000 hours). This shows that the present invention has an advantageous effect of improving the characteristics significantly.

In this manner, use of the mixed gas containing a bromine compound as used in the present embodiment decreases damage to an etched end face during etching even when a filament is provided close to the etched end face. This reduces possibility of occurrence of malfunctioning bits in the nonvolatile memory element 100 according to the present embodiment, and thus has an advantageous effect of improving the characteristics of tail bits.

Next, FIG. 6 shows element content measured in analysis of the $TaO_x$ surface of the variable resistance element 1 using XPS. The curves therein show a result of Ir4f spectral analysis of the $TaO_x$ surface etched using the mixed gas containing a bromine compound in the present embodiment and a result of Ir4f spectral analysis of the $TaO_x$ surface etched using the mixed gas not containing a bromine compound in Comparison example 2. The analysis using XPS was performed under the conditions of incident energy of 150 eV, a pass energy of 100 eV, an energy step of 0.1 eV, an acquisition time of 0.2 ms/step, and a cumulated number of 25. The analyzer used is VG Scienta R4000WAL.

In the present embodiment, a product of a bromine compound ($IrBr_x$) was detected in the $TaO_x$ surface of the variable resistance element 1 at 62 eV and 65 eV. In Comparison example 2, no product of a bromine compound was detected in the $TaO_x$ surface of the variable resistance element.

This shows that in etching of the variable resistance element 1, use of the mixed gas in the present embodiment forms a product of a bromine compound (the sidewall protection films 33a) on the etched end faces 33, and thereby reduces damage caused by deoxidation and impurity implantation during etching.

Figure 11:
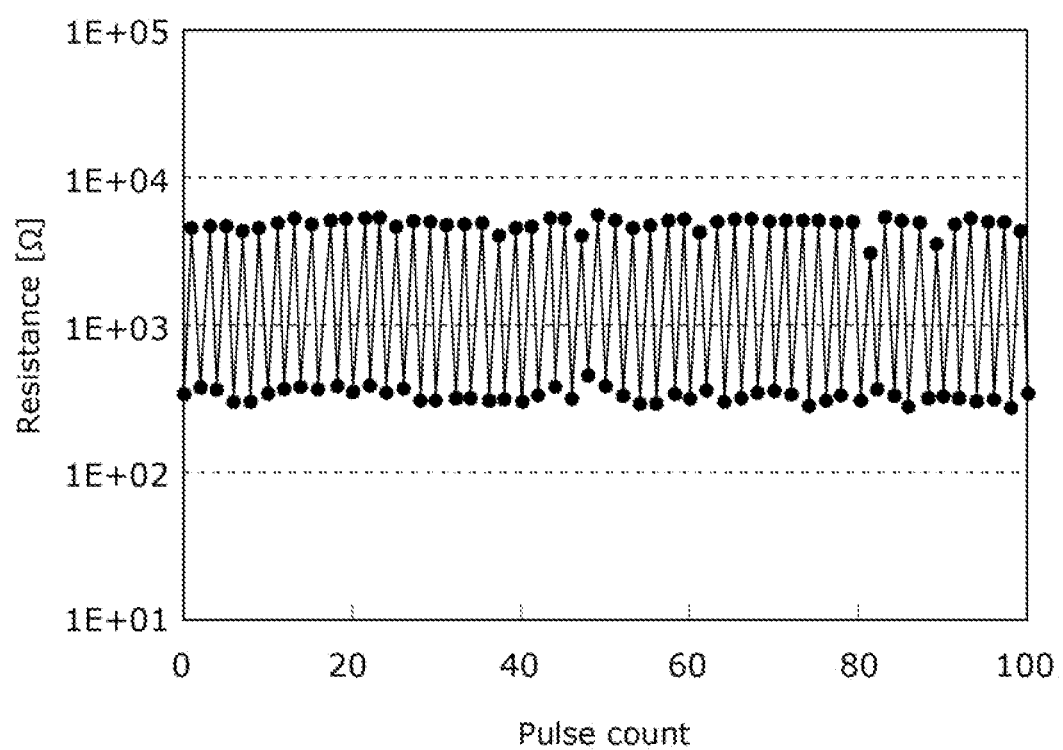
FIG. 11 shows an example of resistance change characteristics of a variable resistance element made using the method according to the present embodiment of the present invention.

FIG. 11 shows an example of resistance change characteristics of a variable resistance element made using the method in the present embodiment. FIG. 11 shows that stable resistance change characteristics were obtained.

Thus, etching the variable resistance layer 3 of the variable resistance element 1 using the mixed gas in the present embodiment provides variable resistance nonvolatile memory elements having less variation in characteristics thereamong and a method of manufacturing the nonvolatile memory elements.

In the method of manufacturing a nonvolatile memory element in the present invention, a product of a bromine compound attaches to an etched end face of a variable resistance layer to form a sidewall protection film, so that deoxidation and impurity implantation due to etching gas are reduced. This leads to reduction of damage to the variable resistance layer in the etching. Variation in characteristics among nonvolatile memory elements is thus reduced, so that nonvolatile memory elements with larger capacity has initial resistance and operation characteristics free from variation therein and thus have favorable retention characteristics.

Bromine (Br) is likely to combine with an object to be etched to form a reaction product and attach to sidewalls. Thus, the product of a bromine compound forms the sidewall protection films 33a as described above, so that impurity implantation and deoxidation are prevented. Materials such as $TaO_x$ have varied resistance depending on the amount of oxygen contained therein. This variation in resistance is caused by implantation of an impurity (for example, fluorine) which hinders movement of oxygen ions included in the materials such as $TaO_x$. Furthermore, decrease in the amount of oxygen contained in the variable resistance layer also causes decrease in resistance, that is, leak. The sidewall protection films 33a have an advantageous effect of preventing such variation in resistance and leak.

Thus, the nonvolatile memory element 100 capable of stable operation may be implemented by providing the variable resistance element 1 in the present invention as, for example, a nonvolatile memory element including one transistor per nonvolatile memory cell.

The present invention is not limited to the above-described embodiments used as a basis of the description of the nonvolatile memory element and the method of manufacturing the nonvolatile memory element according to the present invention. A variable resistance element having a layered structure of transition metal oxides having different degrees of oxygen deficiency as shown in the present embodiment is provided with a protective layer at least on the sidewall of a variable resistance layer so that implantation of an impurity (for example, fluorine) and deoxidation can be prevented. Note that the implantation of an impurity hinders movement of oxygen ions included in the variable resistance layer and thereby causes change in resistance thereof, and that the deoxidation causes decrease in the amount of oxygen contained in the variable resistance layer and thereby causes decrease in resistance, that is, leak. Damage to the variable resistance layer during etching is thus reduced and thereby variation in characteristics among nonvolatile memory elements is reduced, so that nonvolatile memory elements even having a larger capacity are free from variation in initial resistance and operation characteristics and have favorable retention characteristics.

In other words, unless they depart from the spirit and scope of the present invention, variations of the embodiment which would occur to those skilled in the art and embodiments in which the constituent elements in the present embodiment or the variations thereof, are also within the scope of the present invention.

For example, the above-described case where the variable resistance layer is etched using a mixed gas containing hydrogen bromide is a non-limiting example. The mixed gas may contain a material other than hydrogen bromide. For example, use of a mixed gas containing bromine instead of hydrogen bromide is expected to produce the same effect as the present embodiment, and thus is within the scope of the present invention.

Alternatively, use of a mixed gas containing an element other than hydrogen bromide is within the scope of the present invention as far as it satisfies the following conditions and produces the same effect as the present embodiment. Specifically, use of a mixed gas is within the scope of the present invention when the mixed gas contains an element satisfying the following conditions so as to and produce the same effects: (1) the element has an atomic radius than fluorine, which is an impurity to the oxide; (2) the element is not to be substituted by oxygen; and (3) the element is irresponsive to oxygen.

The present invention is applicable to nonvolatile memory elements and methods of manufacturing the nonvolatile memory elements, and particularly to nonvolatile memory elements to be used in electronic devices such as electronic digital appliances, memory cards, personal computers, and mobile computers, and method of manufacturing the nonvolatile memory elements.

The invention claimed is:

1. A method of manufacturing a nonvolatile memory element, the method comprising:
   forming a lower electrode layer above a substrate;
   forming, on the lower electrode layer, a variable resistance layer including an oxygen-deficient transition metal oxide;
   forming an upper electrode layer on the variable resistance layer; and
   forming a patterned mask on the upper electrode layer and etching the upper electrode layer, the variable resistance layer, and the lower electrode layer using the patterned mask,
   wherein, in the etching, at least the variable resistance layer and the lower electrode layer are etched using an etching gas containing bromine,
   wherein, in the forming of the variable resistance layer, the variable resistance layer is formed to comprise a transition metal oxide having resistance which is variable according to an oxygen amount in the transition metal oxide, the resistance being increased by incorporation of an impurity in the variable resistance layer.

2. The method of manufacturing a nonvolatile memory element according to claim 1,
   wherein, in the etching, the etching gas contains hydrogen bromide.

3. The method of manufacturing a nonvolatile memory element according to claim 1,
   wherein, in the forming of the variable resistance layer, the impurity incorporated in the variable resistance layer is fluorine.

4. The method of manufacturing a nonvolatile memory element according to claim 1,
   wherein, in the etching, the etching gas further comprises fluorine.

5. The method of manufacturing a nonvolatile memory element according to claim 1,
   wherein, in the etching,
   a bromine compound is attached at least to an etched end face of the variable resistance layer while the variable resistance layer is being etched.

6. The method of manufacturing a nonvolatile memory element according to claim 1,
   wherein the forming of the variable resistance layer includes:
   forming, on the lower electrode layer, a first variable resistance layer comprising a transition metal oxide; and
   forming, on the first variable resistance layer, a second variable resistance layer comprising a transition metal oxide having a degree of oxygen deficiency lower than a degree of oxygen deficiency of the first variable resistance layer.

7. The method of manufacturing a nonvolatile memory element according to claim 1,
   wherein, in the forming of the variable resistance layer,
   the variable resistance layer is formed to comprise a transition metal oxide having resistance which increases with a decrease in a degree of oxygen deficiency of the variable resistance layer.

8. The method of manufacturing a nonvolatile memory element according to claim 1,
   wherein, in the forming of the variable resistance layer,
   the variable resistance layer is formed to comprise a metal oxide which is a tantalum oxide expressed as $TaO_x$ where $0<x<2.5$.

9. The method of manufacturing a nonvolatile memory element according to claim 1,
   wherein, in the forming of the upper electrode layer,
   the upper electrode layer is formed to comprise one of platinum, iridium, and palladium.

10. The method of manufacturing a nonvolatile memory element according to claim 1,
 wherein, in the etching, the upper electrode layer, the variable resistance layer, and the lower electrode layer are etched using the etching gas containing bromine.

\* \* \* \* \*